(12) United States Patent
Nakagawa et al.

(10) Patent No.: US 11,256,167 B2
(45) Date of Patent: Feb. 22, 2022

(54) SUBSTRATE WITH A MULTILAYER REFLECTIVE FILM, REFLECTIVE MASK BLANK, REFLECTIVE MASK, AND SEMICONDUCTOR DEVICE MANUFACTURING METHOD

(71) Applicant: HOYA CORPORATION, Tokyo (JP)

(72) Inventors: Masanori Nakagawa, Tokyo (JP); Hirofumi Kozakai, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 142 days.

(21) Appl. No.: 16/829,906

(22) Filed: Mar. 25, 2020

(65) Prior Publication Data

US 2020/0310244 A1 Oct. 1, 2020

(30) Foreign Application Priority Data

Mar. 27, 2019 (JP) .............................. JP2019-061658
Mar. 12, 2020 (JP) .............................. JP2020-042971

(51) Int. Cl.
*G03F 1/24* (2012.01)
(52) U.S. Cl.
CPC ...................................... *G03F 1/24* (2013.01)
(58) Field of Classification Search
CPC ....................................................... G03F 1/24
USPC .............................................................. 430/5
See application file for complete search history.

(56) References Cited

U.S. PATENT DOCUMENTS 5,310,603 A 5/1994 Fukuda et al.
5,319,695 A 6/1994 Itoh et al.

FOREIGN PATENT DOCUMENTS

| JP | H05297194 A | 11/1993 |
| JP | H07097159 B2 | 10/1995 |
| JP | 2016519329 A | 6/2016 |
| WO | 2014165298 A1 | 10/2014 |

*Primary Examiner* — Christopher G Young
(74) *Attorney, Agent, or Firm* — Kilpatrick Townsend & Stockton LLP

(57) ABSTRACT

The substrate with a multilayer reflective film includes a substrate and the multilayer reflective film configured to reflect exposure light, the multilayer reflective film comprising a stack of alternating layers on a substrate, the alternating layers including a low refractive index layer and a high refractive index layer, in which the multilayer reflective film contains molybdenum (Mo) and at least one additive element selected from nitrogen (N), boron (B), carbon (C), zirconium (Zr), oxygen (O), hydrogen (H) and deuterium (D), and the crystallite size of the multilayer reflective film calculated from a diffraction peak of Mo (110) by X-ray diffraction is 2.5 nm or less.

20 Claims, 6 Drawing Sheets

SUBSTRATE WITH A MULTILAYER REFLECTIVE FILM, REFLECTIVE MASK BLANK, REFLECTIVE MASK, AND SEMICONDUCTOR DEVICE MANUFACTURING METHOD

CROSS-REFERENCE TO RELATED APPLICATIONS

This application claims priority to Japanese Patent Application No. 2019-061658, filed Mar. 27, 2019, and to Japanese Patent Application No. 2020-042971, filed Mar. 12, 2020, the entire contents of which are hereby incorporated by reference.

BACKGROUND

Technical Field

The present disclosure relates to a reflective mask used in semiconductor device manufacturing or the like, and a substrate with a multilayer reflective film and a reflective mask blank used in manufacturing the reflective mask. The present disclosure also relates to a method of manufacturing a semiconductor device using the reflective mask.

Related Art

Along with high integration of semiconductor devices in the semiconductor industry in recent years, there have been increasing demands for miniaturized patterns exceeding the transfer limit of a conventional photolithography method using ultraviolet light. One promising technique to enable formation of such a miniaturized pattern is EUV lithography, which is an exposure technique using extreme ultra violet (hereinafter referred to as "EUV") light. Here, EUV light refers to light in the wavelength band of the soft X-ray region or the vacuum ultraviolet region, and specifically refers to light having a wavelength of about 0.2 nm to 100 nm. A reflective mask has been proposed as a transfer mask used in this EUV lithography. In such a reflective mask, a multilayer reflective film that reflects exposure light is formed on a substrate, and an absorber film that absorbs exposure light is formed in a pattern on the multilayer reflective film.

The light incident on the reflective mask set in an exposure apparatus is absorbed at a portion where the absorber film is present, and is reflected by the multilayer reflective film at a portion where the absorber film is not present. A reflected image is transferred onto a semiconductor substrate through a reflection optical system to form a mask pattern. Known examples of a multilayer reflective film that reflects EUV light having a wavelength of 13 nm to 14 nm include a film with a stack of alternating layers of Mo and Si having a thickness of several nm.

As a technique for manufacturing a substrate with a multilayer reflective film having such a multilayer reflective film, JP 2016-519329 A discloses an integrated extreme ultraviolet blank production system including: a vacuum chamber for arranging a substrate in a vacuum; a stacking system for stacking a multilayer stack without removing the substrate from the vacuum; and a processing system for processing layers on the multilayer stack stacked as an amorphous metal layer. Description includes amorphous metal layers of amorphous molybdenum and layers alloyed with boron, nitrogen, or carbon.

JP 7-97159 B describes a multilayer reflector for a soft X-ray/vacuum ultraviolet having a multilayer thin film structure formed of alternating layers of high absorption layers and low absorption layers for soft X-ray/vacuum ultraviolet, in which the high absorption layer includes one or more types of borides, carbides, silicides, nitrides or oxides of a transition metal, as a main component, while the low absorption layer includes one or more types of simple substance of carbon, silicon, boron or beryllium or their individual compounds, as a main component.

JP 5-297194 A describes a technique for hydrogenating an interface of each of layers of the multilayer reflective film to prevent interlayer diffusion and to form a smooth interface so as to smooth the interface and surface of the multilayer reflective film.

SUMMARY

In view of improvement in defect quality associated with the recent pattern miniaturization and optical characteristics (such as surface reflectance of the multilayer reflective film) used in a reflective mask, it may be desired to achieve higher smoothness of the substrate with the multilayer reflective film, that is, the interface of each of layers of the multilayer reflective film and/or the surface of the multilayer reflective film. Regarding the improvement of defect quality in a substrate with a multilayer reflective film, smoothing the surface of the substrate with the multilayer reflective film as a defect inspection target, that is, the interface of each of layers of the multilayer reflective film and/or the surface of the multilayer reflective film and reducing the noise (background noise) caused by the roughness of the interface of each of layers of the multilayer reflective film and/or the surface roughness of the multilayer reflective film surface may make it possible to detect a minute defect (defect signal) present on the substrate with the multilayer reflective film.

In the exposure using a reflective mask, exposure light is absorbed by the absorber film formed in a pattern, and the exposure light is reflected by the multilayer reflective film at the portion where the multilayer reflective film is exposed. In order to obtain a high contrast during exposure, it may be desired that the multilayer reflective film achieves high reflectance for the exposure light.

In order to achieve high reflectance of the multilayer reflective film for the exposure light, it is conceivable to improve the crystallinity of each layer constituting the multilayer reflective film (increase the crystal grain size). However, increasing the crystal grain size may also increase noise (background level: BGL) at the time of defect inspection, which may lead to a problem of an increase in the time spent for defect inspection. This result may occur because in a case where the background level at the time of defect inspection is excessively high, noise may be detected as a defect, so that a long time may be spent to determine whether the defect is a real defect contributing to transfer or a pseudo defect not contributing to transfer. There may be another problem caused by the excessively high background level at the time of defect inspection that a real defect contributing to transfer would be erroneously determined as noise and undetected. The occurrence of excessively high background level is considered to be caused by coarsening of crystal grains which deteriorates the smoothness of the interface of each of layers of the multilayer reflective film and/or the surface of the multilayer reflective film. Deterioration of smoothness level of the interface of each of layers of the multilayer reflective film and/or the surface of the multilayer reflective film may increase scattering of the inspection light applied at the time of defect inspection, and this may cause an increase in the background level during the defect inspection.

In view of the above, the present disclosure, in one aspect, discloses a reflective mask blank and a reflective mask including a multilayer reflective film that has a high reflectance for exposure light and a low background level at the time of defect inspection. The present disclosure, in another aspect, discloses a substrate with a multilayer reflective film used to manufacture a reflective mask blank and a reflective mask including a multilayer reflective film that has a high reflectance for exposure light and a low background level at the time of defect inspection. The present disclosure, in still another aspect, discloses a method of manufacturing a semiconductor device using the above-described reflective mask.

The present disclosure, in still another aspect, discloses a substrate with a multilayer reflective film, a reflective mask blank, and a reflective mask that can reliably detect a real defect contributing to transfer.

In view of the above, one aspect of the present disclosure has the following configuration.

(Configuration 1)

Configuration 1 of one aspect of the present disclosure is a substrate with a multilayer reflective film including a substrate; and a multilayer reflective film configured to reflect exposure light, the multilayer reflective film comprising a stack of alternating layers on the substrate, the alternating layers including a low refractive index layer and a high refractive index layer, in which the multilayer reflective film contains molybdenum (Mo) and at least one additive element selected from nitrogen (N), boron (B), carbon (C), zirconium (Zr), oxygen (O), hydrogen (H) and deuterium (D), and the crystallite size of the multilayer reflective film calculated from a diffraction peak of Mo (110) by X-ray diffraction is 2.5 nm or less.

(Configuration 2)

Configuration 2 of one aspect of the present disclosure is a reflective mask blank including: a substrate; a multilayer reflective film configured to reflect exposure light, the multilayer reflective film comprising a stack of alternating layers on the substrate, the alternating layers including a low refractive index layer and a high refractive index layer; and an absorber film formed on the multilayer reflective film or on a protective film on the multilayer reflective film, in which the multilayer reflective film contains molybdenum (Mo) and at least one additive element selected from nitrogen (N), boron (B), carbon (C), zirconium (Zr), oxygen (O), hydrogen (H) and deuterium (D), and the crystallite size of the multilayer reflective film calculated from a diffraction peak of Mo (110) by X-ray diffraction is 2.5 nm or less.

(Configuration 3)

Configuration 3 of one aspect of the present disclosure is a reflective mask including: a substrate; a multilayer reflective film configured to reflect exposure light, the multilayer reflective film comprising a stack of alternating layers on the substrate, the alternating layers including a low refractive index layer and a high refractive index layer; and an absorber pattern formed on the multilayer reflective film or on a protective film on the multilayer reflective film, in which the multilayer reflective film contains molybdenum (Mo) and at least one additive element selected from nitrogen (N), boron (B), carbon (C), zirconium (Zr), oxygen (O), hydrogen (H) and deuterium (D), and the crystallite size of the multilayer reflective film calculated from a diffraction peak of Mo (110) by X-ray diffraction is 2.5 nm or less.

According to one aspect of the present disclosure, it is possible to provide a reflective mask blank and a reflective mask including a multilayer reflective film that has a high reflectance for exposure light and a low background level at the time of defect inspection. The present disclosure, in another aspect, can provide a substrate with a multilayer reflective film used to manufacture a reflective mask blank and a reflective mask including a multilayer reflective film that has a high reflectance for exposure light and a low background level at the time of defect inspection. The present disclosure, in still another aspect, can provide a method of manufacturing a semiconductor device using the above-described reflective mask.

The present disclosure, in still another aspect, can provide a substrate with a multilayer reflective film, a reflective mask blank, and a reflective mask that support reliable detection of real defects contributing to transfer.

DETAILED DESCRIPTION

Hereinafter, several configurations will be specifically described with reference to the drawings. The following configurations are modes for specifically describing aspects of the present disclosure, and these aspects of the present disclosure are not limited within a specific range.

Figure 1:
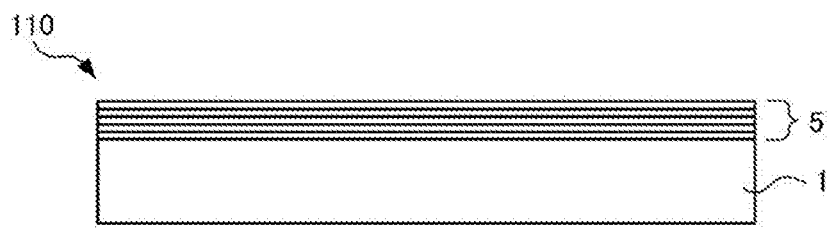
FIG. 1 is a schematic cross-sectional view of an example of a substrate with a multilayer reflective film according to one aspect of the present disclosure.

FIG. 1 illustrates a schematic cross-sectional view of an example of a substrate with a multilayer reflective film 110 according to the present embodiment. As illustrated in FIG. 1, the substrate with a multilayer reflective film 110 according to the present embodiment includes a multilayer reflective film 5 on a substrate 1. The multilayer reflective film 5 is a film for reflecting exposure light, and includes a multilayer film having a stack of a low refractive index layer alternating with a high refractive index layer. The multilayer reflective film 5 in the substrate with a multilayer reflective film 110 of the present embodiment contains molybdenum (Mo) and at least one additive element selected from nitrogen (N), boron (B), carbon (C), zirconium (Zr), oxygen (O), hydrogen (H) and deuterium (D). Details of the low refractive index layer and the high refractive index layer of the multilayer reflective film 5 will be described below. Note that the substrate with a multilayer reflective film 110 of the present embodiment can include a conductive back film 2 on a back surface of the substrate 1 (a main surface opposite to the main surface on which the multilayer reflective film 5 is formed).

Figure 2:
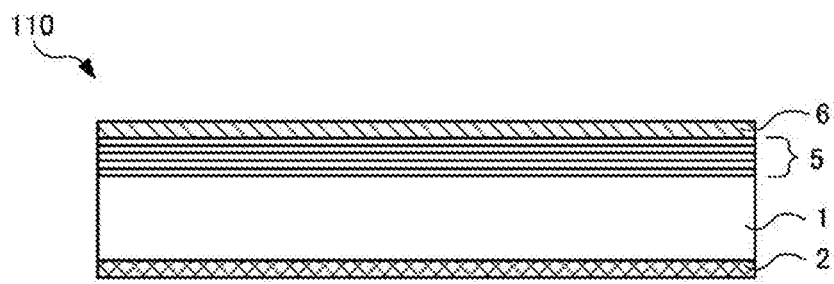
FIG. 2 is a schematic cross-sectional view of another example of a substrate with a multilayer reflective film according to one aspect of the present disclosure.

FIG. 2 illustrates a schematic cross-sectional view of another example of the substrate with a multilayer reflective film 110 of the present embodiment. In the example illustrated in FIG. 2, the substrate with a multilayer reflective film 110 includes a protective film 6.

Figure 3:
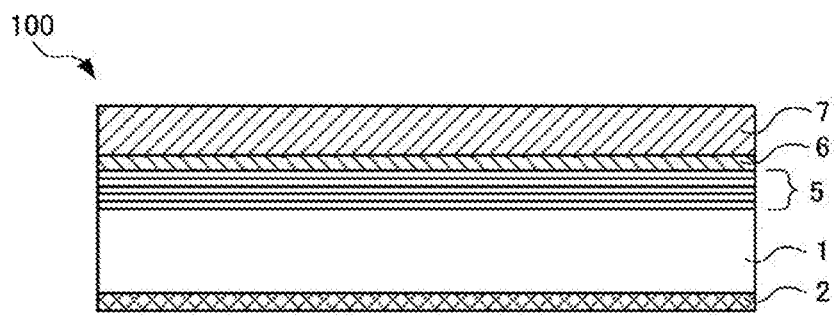
FIG. 3 is a schematic cross-sectional view of an example of one reflective mask blank according to one aspect of the present disclosure.

It is possible to manufacture a reflective mask blank 100 with the use of the substrate with a multilayer reflective film 110 of the present embodiment. FIG. 3 illustrates a schematic cross-sectional view of an example of the reflective mask blank 100. The reflective mask blank 100 further includes an absorber film 7.

Specifically, the reflective mask blank 100 of the present embodiment includes the absorber film 7 on an outermost surface of the substrate with a multilayer reflective film 110 (for example, on the surface of the multilayer reflective film 5 or the protective film 6). With the use of the reflective mask blank 100 of the present embodiment, it is possible to obtain a reflective mask 200 including the multilayer reflective film 5 having a high reflectance for EUV light.

In this specification, the "substrate with a multilayer reflective film 110" refers to a substrate obtained by forming the multilayer reflective film 5 on a predetermined substrate 1. FIGS. 1 and 2 illustrate schematic cross-sectional views of two examples of the substrate with a multilayer reflective film 110. As shown in FIG. 2, examples of the "substrate with a multilayer reflective film 110" include a substrate on which a thin film in addition to the multilayer reflective film 5 (for example, the protective film 6 and/or the conductive back film 2) is formed. In this specification, the "reflective mask blank 100" refers to a substrate obtained by forming the absorber film 7 on the substrate with a multilayer reflective film 110. The "reflective mask blank 100" includes a substrate obtained by further forming a thin film (for example, an etching mask film and a resist film 8) other than the absorber film 7.

In this specification, "disposing (forming) the absorber film 7 above the multilayer reflective film 5 (on the multilayer reflective film 5)" includes a case where the absorber film 7 is disposed (formed) in contact with the surface of the multilayer reflective film 5, and in addition to this case, it also includes a case where another film is provided between the multilayer reflective film 5 and the absorber film 7. The same applies when this language is used with reference to other films. In addition, in this specification, for example, "a film A is disposed in contact with the surface of a film B" indicates that the film A and the film B are disposed to be in direct contact with each other, without interposing another film between the film A and the film B.

<Substrate with a Multilayer Reflective Film 110>

Hereinafter, the substrate 1 and each of the thin films constituting the substrate with a multilayer reflective film 110 of the present embodiment will be described.

<<Substrate 1>>

It may be desired for the substrate 1 in the substrate with a multilayer reflective film 110 of the present embodiment to prevent the occurrence of absorber pattern distortion due to heat during EUV exposure. Therefore, a substrate having a low thermal expansion coefficient (e.g., within a range of 0±5 ppb/° C.) may be used as the substrate 1. Examples of a practically usable material having a low thermal expansion coefficient in this range include $SiO_2$—$TiO_2$ glass and multicomponent glass ceramics.

In view of achieving at least pattern transfer accuracy and position accuracy, a first main surface (which is a side where a transfer pattern of the substrate 1 is formed by the absorber film 7 described below) undergoes surface treatment so as to achieve a predetermined flatness. In the case of EUV exposure, the flatness may be 0.1 μm or less, may further be 0.05 μm or less, and may yet further be 0.03 μm or less in a 132 mm×132 mm region of the first main surface, which is the side where the transfer pattern of the substrate 1 is formed. A second main surface (back surface) opposite to the side on which the absorber film 7 is formed is a surface that undergoes electrostatic chucking when being set in an exposure apparatus. The second main surface may have a flatness of 0.1 μm or less, or further of 0.05 μm or less, or yet further of 0.03 μm or less in a 142 mm×142 mm region.

It may be desired to obtain a high surface smoothness of the substrate 1. The surface roughness of the first main surface (on which a transfer absorber pattern 7a may be formed) may have a root mean square (Rms) value of 0.15 nm or less, or further of 0.10 nm or less. The surface smoothness may be measured with an atomic force microscope.

Furthermore, the substrate 1 may have high rigidity that prevents deformation due to film stress applied by a film (such as the multilayer reflective film 5) formed on the substrate 1. In one example, the substrate 1 may have a high Young's modulus of 65 GPa or more.

<<Base Film 3>>

The substrate with a multilayer reflective film 110 of the present embodiment can have a base film 3 in contact with the surface of the substrate 1. The base film 3 is a thin film formed between the substrate 1 and the multilayer reflective film 5. The base film 3 can have a property according to a desired purpose. For example, it is possible to form a conductive layer that prevents charge build-up during mask pattern defect inspection using an electron beam, a flattening layer that improves the flatness of the surface of the substrate 1, and/or a smoothing layer that improves the smoothness of the surface of the substrate 1.

Examples of the material used for the base film 3 having the conductive property may include materials containing ruthenium or tantalum as a main component. For example, the material may be Ru metal alone or Ta metal alone. Alternatively, the material may be a Ru alloy or a Ta alloy that contains Ru or Ta and at least one metal selected from titanium (Ti), niobium (Nb), molybdenum (Mo), zirconium (Zr), yttrium (Y), boron (B), lanthanum (La), cobalt (Co), and rhenium (Re). The thickness of the base film 3 may be in the range of 1 nm to 10 nm, for example.

In addition, examples of the material used for the base film 3 that improves the flatness and smoothness may include silicon or a material containing silicon as a main component. The material of the base film 3 may be, for example, silicon (Si) alone, or silicon compound containing Si, oxygen (O) and nitrogen (N), such as $SiO_2$, $SiO_x(x<2)$, SiON, $Si_3N_4$, $Si_xN_y$ (natural numbers excluding x:3 or y:4). Similar to the above, the thickness of the base film 3 may be in the range of 1 nm to 10 nm, for example.

<<Multilayer Reflective Film 5>>

The multilayer reflective film 5 provides the reflective mask 200 with a property of reflecting EUV light. The multilayer reflective film 5 is a multilayer film that includes a periodic stack of layers mainly containing elements having different refractive indexes.

Typically, as the multilayer reflective film 5, a multilayer film is used in which a thin film (high refractive index layer) of a light element which is a high refractive index material or a compound thereof and a thin film (low refractive index layer) of a heavy element which is a low refractive index material or a compound thereof are alternated in a stack of about 40 to 60 periods (pairs).

The multilayer film used as the multilayer reflective film 5 may be formed as a periodic stack of layers, wherein each period of the stack is a stack that includes a high refractive index layer and a low refractive index layer, the low refractive index layer being closer to the substrate 1. Alternatively, it may be formed as a periodic stack of layers, wherein each period of the stack is a stack that includes a high refractive index layer and a low refractive index layer, the high refractive index layer being closer to the substrate 1. The outermost layer of the multilayer reflective film 5 (that is, the surface layer of the multilayer reflective film 5 on the side opposite to the substrate 1) may have a high refractive index layer. In the multilayer film described above, in the case of a periodic stack of layers, wherein each period of the stack is a stack that includes a high refractive index layer and a low refractive index layer, the high refractive index layer being closer to the substrate 1, the uppermost layer would be a low refractive index layer. In this case, using the low refractive index layer to form the outermost surface of the multilayer reflective film 5 would be likely to cause oxidation of the surface, which may lead to reduction in the reflectance of the reflective mask 200. Therefore, it may be desired to form a high refractive index layer on the uppermost low refractive index layer to form the multilayer reflective film 5. In contrast, in the multilayer film described above, in the case of a periodic stack of layers, wherein each period of the stack is a stack that includes a high refractive index layer and a low refractive index layer, the low refractive index layer being closer to the substrate 1, the uppermost layer would be a high refractive index layer. Accordingly, it may be desired, in this case, not to form a further high refractive index layer.

The multilayer reflective film 5 of the present embodiment includes molybdenum (Mo) and at least one additive element selected from nitrogen (N), boron (B), carbon (C), zirconium (Zr), oxygen (O), hydrogen (H) and deuterium (D). In the multilayer reflective film 5, the crystallite size calculated from the X-ray diffraction peak of Mo (110) is 2.5 nm or less. The presence of the above additive elements can be confirmed by X-ray photoelectron spectroscopy (XPS), Rutherford backscattering analysis (RBS), energy dispersive X-ray spectroscopy (TEM-EDX), dynamic secondary ion mass spectrometry (SIMS), the elastic recoil detection analysis method (ERDA), or the like. With this configuration, it is possible to obtain a substrate with a multilayer reflective film used to manufacture a reflective mask blank and a reflective mask including a multilayer reflective film that has a high reflectance for exposure light and a low background level at the time of defect inspection.

The low refractive index layer of the multilayer reflective film 5 according to the present embodiment includes molybdenum (Mo), and at least one additive element selected from nitrogen (N), boron (B), carbon (C), zirconium (Zr), oxygen (O), and hydrogen (H). In the low refractive index layer, the crystallite size calculated from the X-ray diffraction peak of Mo (110) is 2.5 nm or less. The presence of the above additive elements can be confirmed by X-ray photoelectron spectroscopy (XPS), Rutherford backscattering analysis (RBS), energy dispersive X-ray spectroscopy (TEM-EDX), or the like. With this configuration, it is possible to obtain a substrate with a multilayer reflective film used to manufacture a reflective mask blank and a reflective mask including a multilayer reflective film that has a high reflectance for exposure light and a low background level at the time of defect inspection.

In the case where the low refractive index layer contains a predetermined additive element and the crystallite size is 2.5 nm or less, it is possible to reduce the roughness of the interface of each of layers of the multilayer reflective film 5 and/or the roughness of the surface of the multilayer reflective film 5 and improve the smoothness. Setting the crystallite size of the low refractive index layer within a predetermined range makes it possible to obtain the multilayer reflective film 5 having a high reflectance for the exposure light and having a low background level at the time of defect inspection. As a result, it is possible to detect a minute defect (defect signal) present in the substrate with a multilayer reflective film 110 with higher accuracy.

Although the low refractive index layer can have an amorphous structure, it may be desired to form the layer in a microcrystalline structure. Accordingly, the crystallite size of the low refractive index layer may be greater than 1.1 nm. With this configuration, in which the crystallite size of the low refractive index layer is greater than 1.1 nm, the low refractive index layer can be formed in a microcrystalline structure, making it possible to achieve higher reflectance of the multilayer reflective film. Increasing the content of the additive element in the low refractive index layer may be expected to reduce the crystallite size and change the microcrystalline structure to an amorphous structure. This change may further improve the smoothness of the interfaces of layers of the multilayer reflective film 5 with one another and/or with the surface of the multilayer reflective film 5. On the other hand, when the content of the additive element in the low refractive index layer is too high, the refractive index of the low refractive index layer with respect to EUV light with a wavelength of 13.5 nm may increase to reduce the difference from the refractive index of the high refractive index layer. At the same time, the extinction coefficient of EUV light in the low refractive index layer may also increase, and this change might cause reduction of the reflectance of the multilayer reflective film 5 to an unacceptable level.

In the substrate with a multilayer reflective film 110 of the present embodiment, setting the crystallite size of the low refractive index layer of the multilayer reflective film 5 within a predetermined range may make it possible to set the reflectance of the multilayer reflective film 5 to EUV light having a wavelength of 13.5 nm to 67% or more. In the reflective mask 200 for manufacturing a semiconductor device, it may be desired for the reflectance of the multilayer reflective film 5 to EUV light having a wavelength of 13.5 nm to be 67% or more.

In the substrate with a multilayer reflective film 110 of the present embodiment, the content of the additive element in the low refractive index layer of the multilayer reflective film 5 may be 0.5 atom % or more and 20 atom % or less, and may further be 0.5 atom % or more and 10 atom % or less. When the content of the additive element in the low refractive index layer is too low, it may be difficult to achieve finer crystal grains of the low refractive index layer. On the other hand, when the content of the additive element in the low refractive index layer is too high, the reflectance of the multilayer reflective film 5 to EUV light having a wavelength of 13.5 nm might be lowered to an unacceptable level. Therefore, the content of the additive element in the low refractive index layer may be in the predetermined range described above. Setting the content of the additive element of the low refractive index layer within a predetermined range may make it possible to reliably obtain the multilayer reflective film 5 having a high reflectance for the exposure light and having a low background level at the time of defect inspection.

The additive element may be nitrogen (N). When nitrogen (N) is used as an additive element, it may be possible to reduce the thickness of a diffusion layer formed between the high refractive index layer and the low refractive index layer (e.g., as described below), which may lead to suppression of reduction in the reflectance of the multilayer reflective film 5. Furthermore, since nitrogen can be added to the film using a process gas (for example, nitrogen gas), it may be possible to suppress dust generation caused by the target, which may lead to suppression of occurrence of defects. Furthermore, the use of nitrogen (N) as an additive element may cause a residue due to etching to be less likely to occur when the multilayer reflective film 5 is etched in order to form a light shielding band or the like.

In the substrate with a multilayer reflective film 110 of the present embodiment, the ratio obtained by dividing the nitrogen content [atom %] in the low refractive index layer of the multilayer reflective film 5 by the total content [atom %] of nitrogen and molybdenum in the low refractive index layer (hereinafter referred to as N/[N+Mo] ratio) may be 0.1% or more and 7.5% or less, and may further be 1.0% or more and 7.5% or less. When the N/[N+Mo] ratio of the low refractive index layer is too low, it may be difficult to achieve finer crystal grains of the low refractive index layer. On the other hand, when the N/[N+Mo] ratio in the low refractive index layer is too high, the reflectance of the multilayer reflective film 5 to EUV light having a wavelength of 13.5 nm might be lowered to an unacceptable level. Therefore, the N/[N+Mo] ratio in the low refractive index layer may be in the predetermined range described above. Setting the N/[N+Mo] ratio in the low refractive index layer within a predetermined range may make it possible to reliably obtain the multilayer reflective film 5 having a high reflectance for the exposure light and having a low background level at the time of defect inspection.

The low refractive index layer may contain at least one selected from ruthenium (Ru), niobium (Nb), rhodium (Rh), and platinum (Pt) in addition to molybdenum (Mo). Since these materials have a refractive index of 0.94 or less with respect to EUV light having a wavelength of 13.5 nm, it may be expected that the refractive index of the low refractive index layer would not increase. Accordingly, it may be expected that the reflectance of the multilayer reflective film 5 would not be reduced.

In the substrate with a multilayer reflective film 110 of the present embodiment, the high refractive index layer of the multilayer reflective film 5 may contain silicon (Si). Examples of applicable materials containing Si include a single substance of Si, or a Si compound containing Si and at least one element selected from boron (B), carbon (C), zirconium (Zr), nitrogen (N), oxygen (O), hydrogen (H) and deuterium (D). Since the main material of the high refractive index layer of the multilayer reflective film 5 is silicon (Si), the reflective mask 200 having excellent EUV light reflectance can be obtained.

For example, the multilayer reflective film 5 for reflecting EUV light having a wavelength of 13 nm to 14 nm may be achieved by using a film having a Mo/Si periodic stack, in which Mo-containing layers alternate with Si-containing layers, with about 40 to 60 periods. Note that it is possible to use a layer containing silicon (Si) (for example, a silicon (Si) layer) to form the high refractive index layer being the uppermost layer of the multilayer reflective film 5, and it is possible to form a silicon oxide layer containing silicon and oxygen between the uppermost layer (layer containing Si) and the protective film 6. With this structure, it is possible to improve mask cleaning resistance.

In the substrate with a multilayer reflective film 110 of the present embodiment, the content of the additive element in the low refractive index layer of the multilayer reflective film 5 may be higher than the content of the additive element in the high refractive index layer. Moreover, it may be that the high refractive index layer of the multilayer reflective film 5 contains substantially no additive element. In a case where silicon (Si) is the main material of the high refractive index layer, adding an additive element to the high refractive index layer may decrease the refractive index for EUV light with a wavelength of 13.5 nm, which may lead to reduction of reflectance of the multilayer reflective film 5. Therefore, in a case where the high refractive index layer contains substantially no additive element, it may be possible to suppress reduction of the reflectance of the multilayer reflective film 5, which may lead to achievement of the multilayer reflective film 5 having a higher reflectance.

When the additive element is hydrogen (H) or deuterium (D), a satisfactory multilayer reflective film may be obtained even when the additive is contained in the high refractive index layer. Adding hydrogen or deuterium at both the formation of the low refractive index layer and formation of the high refractive index layer can lead to a result that hydrogen or deuterium is contained in the low refractive index layer and/or the high refractive index layer. Alternatively, however, hydrogen or deuterium may be contained in the high refractive index layer alone. Forming the low refractive index layer with a film containing at least Mo, adding hydrogen or deuterium to the multilayer reflective film, and setting the crystallite size to at least 2.5 nm or less may allow the multilayer reflective film 5 to have higher reflectance and sufficiently low background level at the time of defect inspection.

With the use of the substrate with a multilayer reflective film 110 of the present embodiment, it is possible to manufacture the reflective mask blank 100 and the reflective mask 200 including the multilayer reflective film 5 having a high reflectance for exposure light and a low background level at the time of defect inspection. With a low background level at the time of defect inspection, it may be possible to perform defect inspection in a relatively short time, and it may be possible to reliably detect a real defect contributing to transfer.

The substrate with a multilayer reflective film 110 of the present embodiment may have a background level (BGL) of less than 400 when a defect inspection is performed on the surface of the multilayer reflective film 5 using a defect inspection apparatus. The background level (BGL) at the time of defect inspection indicates, for example, a background value observed as noise in a case where a defect inspection is performed on the surface of the multilayer reflective film 5 using a blank defect inspection apparatus (Actinic Blank Inspection) that uses EUV light as inspection light. In the case of a blank defect inspection apparatus using EUV light, the background level (BGL) is automatically calculated on the basis of a measurement signal.

The normal reflectance of the multilayer reflective film 5 of the present embodiment alone to EUV light may be 67% or more. With the reflectance of 67% or more, it is possible to use the film for the reflective mask 200 for manufacturing a semiconductor device. A normal upper limit of reflectance may be 73%. The film thickness and the number of periods (number of pairs) of the low refractive index layer and high refractive index layer constituting the multilayer reflective film 5 can be appropriately selected depending on the exposure wavelength. Specifically, the film thickness and the number of periods (number of pairs) of the low refractive index layer and the high refractive index layer constituting the multilayer reflective film 5 can be selected so as to satisfy Bragg's law on reflection. Although a plurality of high refractive index layers and low refractive index layers exists in the multilayer reflective film 5, the high refractive index layers do not have to have a same thickness, and the low refractive index layers do not have to have a same thickness. The thickness of the outermost surface (for example, Si layer) of the multilayer reflective film 5 can be adjusted within a range that would not lower the reflectance. For example, the film thickness of the outermost high refractive index layer (for example, Si layer) can be 3 nm to 10 nm.

In the substrate with a multilayer reflective film 110 of the present embodiment, the multilayer reflective film 5 may include 30 to 60 periods (pairs), with a pair of low refractive index layer and high refractive index layer as one period (pair), and or may include 35 to 55 periods (pairs), or may include 35 to 45 periods (pairs). The greater the number of periods (number of pairs), the higher the reflectance can be obtained. However, an increase in the number of periods may prolong the time for forming the multilayer reflective film 5. Setting the periods of the multilayer reflective film 5 within an appropriate range makes it possible to obtain the multilayer reflective film 5 having a relatively high reflectance within a relatively short time.

The multilayer reflective film 5 of the present embodiment can be formed by an ion beam sputtering method or by a magnetron sputtering method, such as a DC sputtering method and an RF sputtering method. The multilayer reflective film 5 may be formed by the ion beam sputtering method from the viewpoint that impurities are not likely to be mixed in the multilayer reflective film 5 and that the ion source is independent and the condition setting is relatively easy. Forming the multilayer reflective film 5 by the ion beam sputtering using a noble gas (Ar gas, Kr gas, Xe gas, etc.) and a gas containing an additive element ($N_2$ gas, $CH_4$ gas, etc.) as a process gas may be used to obtain a low refractive index layer of the multilayer reflective film 5 containing the additive element.

The gas containing the additive element may be introduced only at formation of the low refractive index layer. However, when the adverse effect of the introduction of the additive element on the high refractive index layer is small, it is possible to introduce a gas containing the additive element even at formation of the high refractive index layer.

Further, the low refractive index layer of the multilayer reflective film 5 of the present embodiment can be formed by using a noble gas as a process gas and a target containing an additive element. For example, it is possible to use a MoN target, a MoB target, a MoC target, a MoZr target, or a MoO target in formation of the low refractive index layer. With various element ratios of the target, the crystallite size and the content of the additive element in the film can be easily adjusted.

In the substrate with a multilayer reflective film 110 of the present embodiment, a diffusion layer might be formed between the low refractive index layer and the high refractive index layer of the multilayer reflective film 5, in some cases. The thickness of the diffusion layer may be 1.7 nm or less, and in some cases no diffusion layer is formed. With this configuration, the thickness of the diffusion layer between the low refractive index layer and the high refractive index layer is 1.7 nm or less, making it possible to suppress the reduction in the reflectance of the multilayer reflective film due to the formation of the diffusion layer. When ion beam sputtering is performed, the material of the high refractive index layer (for example, Si) is diffused into the material of the low refractive index layer (for example, Mo), resulting in formation of a diffusion layer (for example, MoSi diffusion layer). Fortunately, however, with an additive element included in the low refractive index layer, the formation of the diffusion layer can be suppressed, making it possible to suppress the reduction in the reflectance of the multilayer reflective film 5 due to the formation of the diffusion layer.

<<Protective Film 6>>

In the substrate with a multilayer reflective film 110 of the present embodiment, the protective film 6 may be formed on the multilayer reflective film 5 as illustrated in FIG. 2. Forming the protective film 6 on the multilayer reflective film 5 makes it possible to avoid damage to the surface of the multilayer reflective film 5 when the reflective mask 200 is manufactured using the substrate with a multilayer reflective film 110. This suppression may lead to achieving satisfactory reflectance characteristics for the EUV light of the reflective mask 200 to be obtained.

The protective film 6 is formed on the multilayer reflective film 5 in order to protect the multilayer reflective film 5 from dry etching and cleaning in the manufacturing process of the reflective mask 200 described below. The protective film 6 may also serve to protect the multilayer reflective film 5 during black defect correction of a mask pattern using an electron beam (EB). Here, FIG. 2 illustrates a case where the protective film 6 has one layer. Alternately, however, the protective film 6 may have a stack of two layers, or the protective film 6 may have a stack of three or more layers, in which the lowermost layer and the uppermost layer are formed into layers formed of a substance containing Ru, for example, and a metal other than Ru or an alloy not containing Ru can be interposed between the lowermost layer and the uppermost layer. The protective film 6 is formed of, for example, a material containing ruthenium as a main component. Examples of a material containing ruthenium as a main component include Ru metal alone; a Ru alloy that contains Ru and at least one metal selected from titanium (Ti), niobium (Nb), molybdenum (Mo), zirconium (Zr), yttrium (Y), boron (B), lanthanum (La), cobalt (Co), and rhenium (Re); and any of these materials that further contains nitrogen. For example, the protective film 6 may be formed of a Ru-based material containing Ti. In a case where the constituent element of the multilayer reflective film 5 is silicon, using the protective film 6 formed of a Ru-based material containing Ti may suppress a phenomenon that silicon diffuses from the surface of the multilayer reflective film 5 to the protective film 6. Suppressing this phenomenon may reduce surface roughness during mask cleaning and suppress film peeling. Reduction of surface roughness is directly linked to prevention of reduction of the reflectance of the multilayer reflective film 5 for EUV exposure light, and thus is important for improving the exposure efficiency and throughput of EUV exposure.

The Ru content ratio of the Ru alloy used for the protective film 6 may be 50 atom % or more and less than 100 atom %, may further be 80 atom % or more and less than 100 atom %, and may yet further be 95 atom % or more and less than 100 atom %. In particular, when the Ru content ratio of the Ru alloy is 95 atom % or more and less than 100 atom %, it is possible to suppress diffusion of the constituent elements (for example, silicon) of the multilayer reflective film 5 into the protective film 6. In this case, the protective film 6 is capable of providing mask cleaning resistance, serving as an etching stopper film during an etching process of the absorber film 7, and preventing aging in the multilayer reflective film 5 while sufficiently ensuring the EUV light reflectance.

In EUV lithography, since there are few substances that are transparent to exposure light, it may be technically difficult to apply an EUV pellicle that prevents foreign matter from adhering to the mask pattern surface. For such reasons, pellicle-less operation without using a pellicle has been the mainstream. Moreover, the EUV lithography has occurrences of exposure contamination such as carbon film deposition on the reflective mask 200 or an oxide film growth by EUV exposure. For such reasons, it may be desired to frequently clean and remove foreign matter and contamination on the reflective mask 200 at a stage where the reflective mask 200 is used for manufacturing a semiconductor device. For such reasons, the EUV reflective mask 200 may have an extraordinary mask cleaning resistance as compared with a transmissive mask for optical lithography. Using the protective film 6 formed of a Ru-based material containing Ti, it is possible to particularly increase the cleaning resistance for a cleaning solution such as sulfuric acid, sulfuric acid/hydrogen peroxide (SPM), ammonia, ammonia hydrogen peroxide (APM), OH radical cleaning water, and ozone water having a concentration of 10 ppm or less, making it possible for the mask cleaning resistance.

The thickness of the protective film 6 is not particularly limited as long as the desired purpose or purposes of the protective film 6 can be implemented. From the viewpoint of EUV light reflectance, the thickness of the protective film 6 is may be 1.0 nm to 8.0 nm, and may further be 1.5 nm to 6.0 nm.

As a method for forming the protective film 6, it is possible to adopt a known film forming method without any particular limitation. Specific examples of the method for forming the protective film 6 include a sputtering method and an ion beam sputtering method.

<Heat Treatment (Annealing)>

In general, it may be desired to increase the film density of the low refractive index layer and the high refractive index layer of the multilayer reflective film 5 in order to obtain a high reflectance to short-wavelength light. This density increase may give the multilayer reflective film 5 a high compressive stress. Therefore, heat treatment is usually performed to reduce the film stress after formation of the multilayer reflective film 5 (or protective film 6). In this, the higher the heat treatment temperature of the multilayer reflective film 5, the more the film stress of the multilayer reflective film 5 can be reduced, but this treatment may also cause a problem of reduction in the reflectance of the multilayer reflective film 5 to EUV light.

In the multilayer reflective film 5 of the present embodiment, the film stress can be reduced by adding the above-described additive element to the low refractive index layer of the multilayer reflective film 5. This makes it possible to obtain the substrate with a multilayer reflective film 110 having high reflectance without performing heat treatment. In addition, even when heat treatment is applied to the multilayer reflective film 5, it is possible to use low heat treatment temperature, and thus, high reflectance can be maintained.

The film stress of the multilayer reflective film 5 was evaluated when the additive element was nitrogen. At formation of the multilayer reflective film 5 by ion beam sputtering, the deformation amount (for example, CTIR) of the substrate 1 was measured under various nitrogen gas flow rates and the heat treatment (annealing) temperatures, whereby reduction levels of the film stress of the multilayer reflective film 5 was evaluated.

The following will describe Coordinate Total Indicator Reading (CTIR) as a parameter indicating the deformation amount of the substrate with a multilayer reflective film 110 due to the film stress of the multilayer reflective film 5. First, the main surface of the substrate 1 before formation of the multilayer reflective film 5 is measured to obtain the surface shape of the substrate 1 before formation of the multilayer reflective film 5. Next, the surface of the substrate with a multilayer reflective film 110 having the multilayer reflective film 5 formed on the main surface of the substrate 1 is measured to obtain the surface shape after formation of the multilayer reflective film 5. CTIR is an absolute value of a difference between the highest value and the lowest value in a difference shape calculated between the surface shape of the substrate 1 and the surface shape of the substrate with a multilayer reflective film 110.

CTIR of the substrate with a multilayer reflective film 110 that has not undergone the heat treatment in Samples 1 to 8 described below was measured. In addition, CTIR was measured when the heat treatment (annealing) temperature was set to 50° C., 100° C., 150° C., and 200° C. for the substrate with a multilayer reflective film 110 fabricated under the same conditions as Samples 1 to 8. The heat treatment (annealing) time was 10 minutes. In the CTIR measurement of the substrate with a multilayer reflective film 110, a flatness measuring apparatus (UltraFlat200 manufactured by Tropel) was used and evaluation was performed according to CTIR at a 132 mm square within a formation area of the multilayer reflective film 5. Evaluation results are illustrated in Table 1 and FIG. 9. In Table 1 and FIG. 9, "+" indicates the presence of a compressive stress, while "−" indicates the presence of a tensile stress.

CTIR may be −100 nm to 350 nm in consideration of cancelling effects with the conductive back film 2 which often has a compressive stress. In the substrate with a multilayer reflective film 110 of the present embodiment, it is possible to adjust the heat treatment (annealing) temperature to select CTIR that can cancel out the film stress of the conductive back film 2. For example, as observed from Table 1 and FIG. 9, it is possible to set the CTIR to be in the range of 0 nm to 350 nm without performing heat treatment, when the crystallite size is 1.3 to 1.6 nm. In a case where the crystallite size is 1.4 nm to 2.0 nm, it is possible to set the CTIR to be in the range of −100 nm to 350 nm at a heat treatment (annealing) temperature of 50° C. In a case where the crystallite size is 1.6 nm to 2.3 nm, it is possible to set the CTIR to be in the range of −100 nm to 350 nm at a heat treatment (annealing) temperature of 100° C. In a case where the crystallite size is 2.0 nm to 2.5 nm, it is possible to set the CTIR to be in the range of 0 nm to 350 nm at a heat treatment (annealing) temperature of 150° C. In a case where the crystallite size is 2.3 nm to 2.5 nm, it is possible to set the CTIR to be in the range of 0 nm to 350 nm at a heat treatment (annealing) temperature of 200° C.

The multilayer reflective film 5 of the present embodiment may not undergo heat treatment, and even when heat treatment is applied, the heat treatment can be performed at a low temperature of 100° C. or less. This makes it possible to obtain the substrate with a multilayer reflective film 110 having a low film stress while maintaining a high reflectance. In addition, the film stress can be made zero while maintaining a high reflectance. The substrate with a multilayer reflective film 110 of the present embodiment can reduce the deformation amount (CTIR) of the substrate with a multilayer reflective film 110, enabling improvement of the shape accuracy and position accuracy of the mask pattern.

<Reflective Mask Blank 100>

An embodiment of the reflective mask blank 100 according to the present embodiment will be described. By using the reflective mask blank 100 of the present embodiment, it is possible to manufacture the reflective mask 200 having the multilayer reflective film 5 that has a high reflectance for exposure light and a low background level at the time of defect inspection.

<<Absorber Film 7>>

The reflective mask blank 100 has the absorber film 7 on the above-described substrate with a multilayer reflective film 110. That is, the absorber film 7 is formed on the multilayer reflective film 5 (on the protective film 6, if the protective film 6 is formed). The basic purpose of the absorber film 7 is to absorb EUV light. The absorber film 7 may be the absorber film 7 provided for the purpose of absorbing EUV light, or may be the absorber film 7 having a phase shift property in view of the phase difference of EUV light. The absorber film 7 having a phase shift property absorbs EUV light and reflects a part of the light to shift the phase. That is, in the reflective mask 200 on which the absorber film 7 having a phase shift property is patterned, the portion where the absorber film 7 is formed absorbs EUV light to attenuate the light, while reflecting part of the light at a level not adversely affecting pattern transfer. EUV light is reflected from the multilayer reflective film 5 through the protective film 6 in a region (field portion) where the absorber film 7 is not formed. These effects would give a desired phase difference between the reflected light from the absorber film 7 having a phase shift property and the reflected light from the field portion. The absorber film 7 having the phase shift property is formed such that the phase difference between the reflected light from the absorber film 7 and the reflected light from the multilayer reflective film 5 falls in a range from 170 degrees to 190 degrees. Light beams having inverted phase differences near 180 degrees interfere with each other at a pattern edge portion, thereby improving image contrast of the projection optical image. Image contrast improvement also improves the resolution, making it possible to increase various tolerances relating to exposure such as exposure tolerance and focus tolerance.

The absorber film 7 may be a single layer film or a multilayer film that includes a plurality of layers. In the case of a single layer film, the number of processes at the time of manufacturing a mask blank can be reduced and production efficiency is increased. In the case of a multilayer film, its optical constant and film thickness can be appropriately set so that the upper absorber film layer becomes an antireflection film at the time of mask pattern inspection using light. This characteristic may improve the inspection sensitivity at the time of mask pattern inspection using light. Furthermore, a film to which oxygen (O), nitrogen (N), or the like has been added (e.g., to improve oxidation resistance) may be used for the upper absorber film layer, which may improve the temporal stability. In this manner, forming the absorber film 7 by a multilayer film enables the absorber film 7 to fulfill various purposes. In a case where the absorber film 7 is an absorber film 7 having a phase shift property, it is possible to increase the adjustment range on the optical surface by using a multilayer film, facilitating acquisition of desired reflectance.

The material of the absorber film 7 is not particularly limited as long as the material absorbs EUV light and can be processed by etching or the like (for example, can be etched by dry etching of chlorine (Cl) or fluorine (F) gas). As examples of materials having such properties, tantalum (Ta) alone or a tantalum compound containing Ta as a main component may be used.

The above-described absorber film 7 formed of tantalum or a tantalum compound can be formed by a magnetron sputtering method, such as a DC sputtering method or an RF sputtering method. For example, the absorber film 7 can be formed by the reactive sputtering method using an argon gas to which oxygen or nitrogen is added and using a target containing tantalum and boron.

The tantalum compound for forming the absorber film 7 includes a Ta alloy. When the absorber film 7 is formed of a Ta alloy, the crystalline state of the absorber film 7 may be an amorphous or microcrystalline structure from the viewpoint of smoothness and flatness. If the surface of the absorber film 7 lacks smoothness and flatness, the edge roughness of the absorber pattern 7a may increase, which may lead to degradation of the dimensional accuracy of the pattern. A surface roughness of the absorber film 7 may have a root mean square (Rms) value of 0.5 nm or less, and may further be 0.4 nm or less, and may yet further be 0.3 nm or less.

Examples of the tantalum compound for forming the absorber film 7 include a compound containing Ta and B; a compound containing Ta and N; a compound containing Ta, O and N; a compound containing Ta and B and further containing at least one of O or N; a compound containing Ta and Si; a compound containing Ta, Si and N; a compound containing Ta and Ge; and a compound containing Ta, Ge and N.

Ta is a material that has a large EUV light absorption coefficient and can be easily dry-etched with a chlorine-based gas or a fluorine-based gas. Therefore, Ta can be a material for the absorber film 7 having excellent processability. Furthermore, an amorphous material can be easily obtained by adding B, Si and/or Ge or the like to Ta, which may improve the smoothness of the absorber film 7. Furthermore, adding N and/or O to Ta may improve the resistance of the absorber film 7 to oxidation, making it possible to improve the temporal stability.

Examples of materials to constitute the absorber film 7, other than tantalum or a tantalum compound, include chromium and chromium compounds such as Cr, CrN, CrCON, CrCO, CrCOH, and CrCONH, and materials such as WN, TiN, and Ti.

<<Conductive Back Film 2>>

On the second main surface (back surface) of the substrate 1 (on the opposite side of the formation surface of the multilayer reflective film 5, or on an intermediate layer 4 such as a hydrogen infiltration suppression film in a case where such an intermediate layer is formed on the substrate 1 as shown in FIGS. 4A-E), the conductive back film 2 for an electrostatic chuck is to be formed. For electrostatic chucks, the sheet resistance for the conductive back film 2 is usually 100 Ω/sq or less. The method for forming the conductive back film 2 is, for example, a magnetron sputtering method or an ion beam sputtering method using a target of a metal such as chromium or tantalum, or an alloy thereof. The material containing chromium (Cr) for the conductive back film 2 may be a Cr compound that contains Cr and at least one substance selected from boron, nitrogen, oxygen, and carbon. Examples of the Cr compound include CrN, CrON, CrCN, CrCON, CrBN, CrBON, CrBCN, and CrBOCN. Examples of the material containing tantalum (Ta) for the conductive back film 2 include Ta (tantalum); an alloy containing Ta; or a Ta compound containing Ta or such an alloy and at least one from boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, and TaSiCON. The thickness of the conductive back film 2 is usually 10 nm to 200 nm while there is no particular limitation as long as the purpose of an electrostatic chuck is satisfied. The conductive back film 2 may further provide stress adjustment on the second main surface side of the mask blank 100. That is, the conductive back film 2 may be adjusted so as to obtain a flat reflective mask blank 100 in balance with the stress from various films formed on the first main surface side.

Note that the conductive back film 2 can be formed on the substrate with a multilayer reflective film 110 before the above-described absorber film 7 is formed. In that case, the substrate with a multilayer reflective film 110 provided with the conductive back film 2 as illustrated in FIG. 2 can be obtained.

<Other Thin Films>

The substrate with a multilayer reflective film 110 and the reflective mask blank 100 manufactured by the manufacturing method according to the present embodiment can include an etching hard mask film (also referred to as "etching mask film") and/or a resist film 8 on the absorber film 7. Examples of typical materials of the etching hard mask film include: silicon (Si); a material having at least one element selected from oxygen (O), nitrogen (N), carbon (C) and hydrogen (H) added to silicon; chromium (Cr); and a material having at least one element selected from oxygen (O), nitrogen (N), carbon (C) and hydrogen (H) added to chromium. Specific examples include $SiO_2$, SiON, SiN, SiO, Si, SiC, SiCO, SiCN, SiCON, Cr, CrN, CrO, CrON, CrC, CrCO, CrCN, and CrOCN. However, when the absorber film 7 is a compound containing oxygen, it is possible to avoid using a material containing oxygen ($SiO_2$, for example) as the etching hard mask film from the viewpoint of etching resistance. Forming an etching hard mask film enables reduction of the thickness of the resist film 8, which allows for pattern miniaturization.

Between a glass substrate forming the substrate 1 and the conductive back film 2 containing tantalum or chromium, the substrate with a multilayer reflective film 110 and the reflective mask blank 100 of the present embodiment may include a hydrogen infiltration suppression film that suppresses infiltration of hydrogen from the substrate 1 to the conductive back film 2. Due to the presence of the hydrogen infiltration suppression film, it is possible to suppress the incorporation of hydrogen into the conductive back film 2 and to suppress an increase in the compressive stress of the conductive back film 2.

The material of the hydrogen infiltration suppression film may be of any type of material as long as the material has low hydrogen permeability and high capability of suppressing the infiltration of hydrogen from the substrate 1 to the conductive back film 2. Examples of the material of the hydrogen infiltration suppression film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO, and TaON. The hydrogen infiltration suppression film can be a single layer of these materials or may be a multiple layer. In either case, the hydrogen infiltration suppression film may be a compositionally graded film.

<Reflective Mask 200>

The present embodiment is the reflective mask 200 having the absorber pattern 7a on the multilayer reflective film 5 by patterning the absorber film 7 of the reflective mask blank 100 described above. By using the reflective mask blank 100 of the present embodiment, it is possible to obtain the reflective mask 200 having the multilayer reflective film 5 that has a high reflectance for exposure light and a low background level at the time of defect inspection.

The reflective mask 200 is manufactured using the reflective mask blank 100 of the present embodiment. Here, an outline description will be simply given, and a detailed description will be given below in Example with reference to the drawings.

A reflective mask blank 100 is prepared, and a resist film 8 is formed (unnecessary when the resist film 8 is provided as the reflective mask blank 100) on the outermost surface (on the absorber film 7 as described in the following Example) of the first main surface. A desired pattern such as a circuit pattern is drawn (exposed) on this resist film 8, and further developed and rinsed to form a predetermined resist pattern 8a.

Using the resist pattern 8a as a mask, the absorber film 7 is dry-etched to form the absorber pattern 7a. The etching gas to be used can be selected from: a chlorine-based gas such as $Cl_2$, $SiCl_4$, and $CHCl_3$; a mixed gas containing a chlorine-based gas and $O_2$ at a predetermined ratio; a mixed gas containing a chlorine-based gas and He at a predetermined ratio; a mixed gas containing chlorine-based gas and Ar at a predetermined ratio; fluorine-based gas, such as $CF_4$, $CHF_3$, $C_2F_6$, $C_3F_6$, $C_4F_6$, $C_4F_8$, $CH_2F_2$, $CH_3F$, $C_3F_8$, $SF_6$, or $F_2$; and a mixed gas containing a fluorine-based gas and $O_2$ at a predetermined ratio. Here, an etching gas containing oxygen in the final stage of etching might cause surface roughness of the Ru-based protective film 6. Therefore, it is possible to use an etching gas that does not contain oxygen in the over-etching stage in which the Ru-based protective film 6 is exposed to etching.

Thereafter, the resist pattern 8a is removed by ashing or resist stripping solution, so as to fabricate the absorber pattern 7a on which a desired circuit pattern is formed.

Through the above processes, the reflective mask 200 of the present embodiment can be obtained.

<Method for Manufacturing Semiconductor Device>

A method for manufacturing a semiconductor device according to the present embodiment includes a process of performing a lithography process on an exposure apparatus using the reflective mask 200 described above to form a transfer pattern on a transfer object.

In the present embodiment, the reflective mask 200 having the multilayer reflective film 5 achieving a high reflectance with respect to exposure light and a low background level at the time of defect inspection can be used for manufacturing a semiconductor device. This leads to improvement of the throughput in manufacturing the semiconductor device. Furthermore, since the semiconductor device is manufactured using the reflective mask 200 having no real defect contributing to transfer on the multilayer reflective film 5, it is possible to avoid a decrease in the yield of the semiconductor device due to the defect of the multilayer reflective film 5.

Specifically, a desired transfer pattern can be formed on a semiconductor substrate by performing EUV exposure using the reflective mask 200 of the present embodiment. With various processes such as etching of films to be processed, formation of insulating films and conductive films, introduction of dopants, or annealing in addition to this lithography process, it is possible to manufacture, at a high yield, semiconductor devices on which desired electronic circuits are formed.

Example

Hereinafter, Examples and Comparative Examples will be described with reference to the drawings. In Examples, same reference numerals will be used for the same components, and the description will be simplified or omitted.

As illustrated in FIG. 1, the substrate with a multilayer reflective film 110 according to Examples includes the substrate 1 and the multilayer reflective film 5.

An $SiO_2$—$TiO_2$ glass substrate, which is a low thermal expansion glass substrate of 6025 size (approximately 152 mm×152 mm×6.35 mm), in which both the first main surface and the second main surface are polished, was prepared as the substrate 1. Polishing including a rough polishing process, a precision polishing process, a local processing process, and a touch polishing process was performed so as to obtain a flat and smooth main surface.

Next, the multilayer reflective film 5 was formed on the main surface (first main surface) of the substrate 1. The multilayer reflective film 5 formed on the substrate 1 is a periodic multilayer reflective film 5 formed of Mo and Si in order to form the multilayer reflective film 5 suitable for EUV light having a wavelength of 13.5 nm. The multilayer reflective film 5 was formed by using an Mo target and a Si target and alternately layering a Mo film and a Si film on the substrate 1 by the ion beam sputtering method using a predetermined process gas and a predetermined target. First, a Si film was formed with a thickness of 4.2 nm, and then a Mo film was formed with a thickness of 2.8 nm. This was set as one period, and a stack of 40 such periods was formed in a similar manner. Finally, a Si film was formed with a thickness of 4.0 nm, so as to form the multilayer reflective film 5.

Table 1 illustrates gases and flow rates used in forming the multilayer reflective films 5 of samples 1 to 8 of Examples and Comparative Examples. Samples 2 to 7 correspond to Examples of the present disclosure, and Samples 1 and 8 correspond to Comparative Examples. In Samples 2 to 8, $N_2$ gas was used in addition to Kr gas at formation of the multilayer reflective film 5 to introduce nitrogen ($N_2$) into the low refractive index layer of the multilayer reflective film 5. The same Kr gas and $N_2$ gas as those for the low refractive index layer were also used for formation of the high refractive index layer. In the case of Sample 8, the crystallite size was 1.1 nm because of the high flow rate of nitrogen ($N_2$) during the formation of the low refractive index layer of the multilayer reflective film 5.

Table 2 illustrates process gases, flow rates, and targets used for the formation of the multilayer reflective film 5 of Samples 9 to 11 in Examples. In Samples 9 and 10, a MoZr target was used to introduce zirconium (Zr) into the low refractive index layer of the multilayer reflective film 5. In Sample 11, a MoB target was used to introduce boron (B) into the low refractive index layer of the multilayer reflective film 5.

Table 3 illustrates the process gas volume ratio or the like at formation of the multilayer reflective film 5 of Samples 12 to 14 in Examples. In Samples 12 and 13, $H_2$ gas (hydrogen gas) was used in addition to Kr gas, which is a noble gas, at the formation of the multilayer reflective film 5 using the Mo target and the Si target so as to introduce Hydrogen (H) into the multilayer reflective film 5. In the present Examples, the same Kr gas and $H_2$ gas were used in the formation of the low refractive index layer and the high refractive index layer, with the same volume ratios of these process gases. In Sample 14, deuterium gas ($D_2$ gas) was used in addition to Kr gas, which is a noble gas, at the formation of the multilayer reflective film 5 using the Mo target and the Si target so as to introduce deuterium (D) into the multilayer reflective film 5. In the present Examples, the same Kr gas and $D_2$ gas were used in the formation of the low refractive index layer and the high refractive index layer, with the same volume ratios of these process gases. While these Examples selected Kr gas as the noble gas, there is no limitation and Ar gas or Xe gas can also be used. Furthermore, the volume ratio of the process gas can be varied during formation of the low refractive index layer and/or during formation of the high refractive index layer.

Samples 1 to 14 of the substrate with a multilayer reflective film 110 were manufactured as described above.

<Evaluation of Substrate with the Multilayer Reflective Film 110>

The evaluation of the substrate with a multilayer reflective film 110 of Samples 1 to 14 was performed by the following evaluation method.

<<Crystallite Size>>

The crystallinity of the multilayer reflective film 5 of the substrate with a multilayer reflective film 110 of individual Samples produced as described above was measured by the X-ray diffraction method. As a result, a diffraction peak of Mo (110) was confirmed as X-ray diffraction from the multilayer reflective film 5. Tables 1 to 3 illustrate crystallite sizes calculated from the diffraction peak of Mo (110). The crystallite size was calculated using the Scherrer equation illustrated below.

Crystallite size (nm)=$0.9\lambda/\beta \cos\theta$ $$\beta=(\beta_e^2-\beta_0^2)^{1/2}$$

Where $\lambda$: 0.15418 nm
$\beta$: Correction value (rad) for half width of diffraction peak
$\beta_e$: Measured value of half width of diffraction peak
$\beta_0$: Half-width device constant (0)
$\theta$: Bragg angle (½ of the diffraction angle 2θ).

Figure 5:
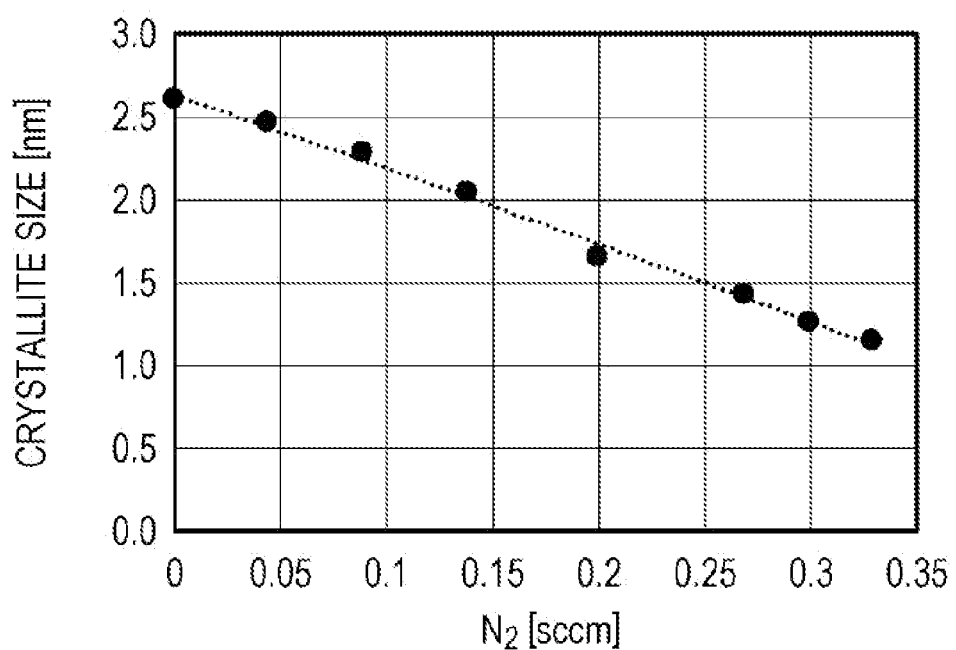
FIG. 5 is a diagram illustrating a relationship between a flow rate (in standard cubic centimeters per minute or sccm) of nitrogen ($N_2$) during formation of the multilayer reflective film and the crystallite size calculated from the diffraction peak of Mo (110) regarding Samples 1 to 8.

FIG. 5 is a graph plotting a relationship between a flow rate (sccm) of nitrogen ($N_2$) during the formation of the multilayer reflective films 5 and the crystallite size calculated from the diffraction peak of Mo (110) regarding Samples 1 to 8.

<<TEM-EDX Analysis>>

The presence or absence of an additive element in the low refractive index layer was confirmed by TEM-EDX analysis. As a result, it was confirmed that Samples 2 to 8 contained nitrogen (N), Samples 9 and 10 contained zirconium (Zr), and Sample 11 contained boron (B), whereas Sample 1 contained no additive element. Table 1 illustrates the N/[N+Mo] ratio regarding Samples 2 to 8.

<<Dynamic SIMS>>

The presence or absence of an additive element (H or D) contained in the multilayer reflective film 5 was confirmed by using dynamic SIMS (quadrupole secondary ion mass spectrometer: PHI ADEPT-1010 (trademark), manufactured by ULVAC-PHI Co., Ltd.). Measurement conditions are $Cs^+$ for primary ion species, 1.0 kV for primary acceleration voltage, 90 μm square for primary ion irradiation area, positive secondary ion polarity, $[Cs—H]^+$ or $[Cs-D]^+$ for detection secondary ion species. The standard sample was Si. As a result, it was confirmed that Samples 12 and 13 contained hydrogen (H) and Sample 14 contained deuterium (D).

<<Diffusion Layer Thickness>>

For the multilayer reflective film 5 of the substrate with a multilayer reflective film 110 of Samples 1 to 8, the thickness of the diffusion layer per period of the Mo layer and the Si layer was calculated. First, the X-ray reflectance method (XRR) was used to calculate an average thickness of individual MoSi diffusion layers formed when Mo particles were incident on the Si layer (thickness of the MoSi diffusion layer on the Si layer: D1) and an average thickness of individual MoSi diffusion layers formed when Si particles were incident on the Mo layer (thickness of the MoSi diffusion layer on the Mo layer: D2). Subsequently, the sum of D1 and D2 were calculated to obtain the diffusion layer thickness per period of the Mo layer and the Si layer. Table 1 illustrates the thicknesses of D1, D2 and the diffusion layer. Similarly, the thicknesses of the diffusion layers of Samples 9 to 14 were calculated to be all 1.7 nm or less.

<<Reflectance>>

Figure 8:
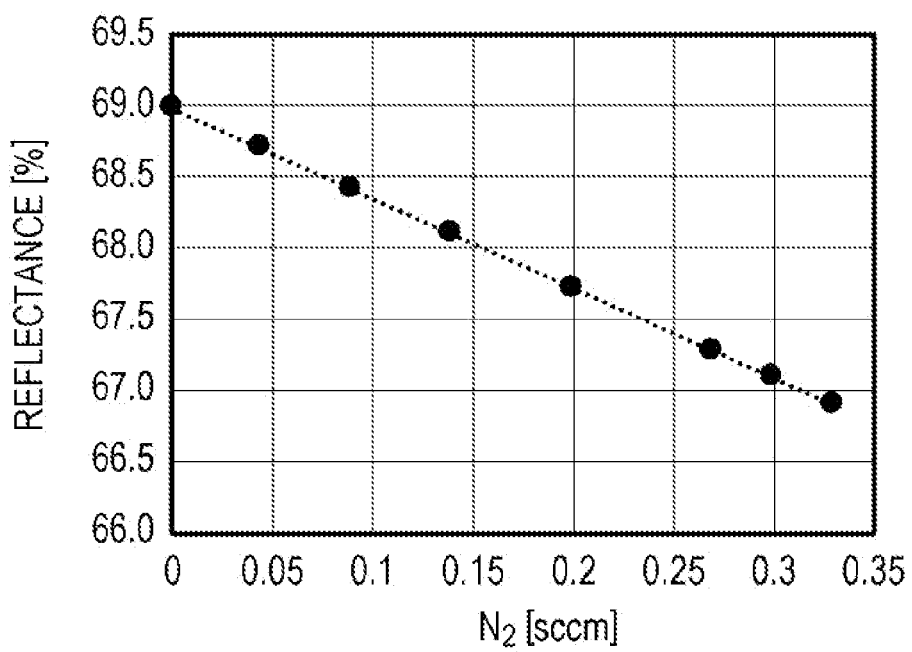
FIG. 8 is a diagram illustrating a relationship between the flow rate (sccm) of nitrogen ($N_2$) during formation of the multilayer reflective film and the reflectance to EUV light with a wavelength of 13.5 nm regarding Samples 1 to 8.

The reflectance of the multilayer reflective film 5 of the substrate with a multilayer reflective film 110 in Samples 1 to 14 for the EUV light having a wavelength of 13.5 nm was measured. Tables 1 to 3 illustrate measurement results of the reflectance. FIG. 8 is a graph plotting a relationship between the reflectance and the flow rate (sccm) of nitrogen ($N_2$) at formation of the multilayer reflective film 5 of Samples 1 to 8 illustrated in Table 1.

<<Background Level (BGL)>>

Defect inspection was performed on the substrate with a multilayer reflective film 110 of individual Samples, and the background level (BGL) of the multilayer reflective film 5 was measured. The background level (BGL) is automatically measured when the defect inspection of the multilayer reflective film 5 is measured by a predetermined defect inspection apparatus. The measurement result of the background level (BGL) is illustrated in the "BGL" column of Tables 1 to 3. The defect inspection apparatus for defect inspection of the substrate with a multilayer reflective film 110 used was a blank defect inspection apparatus (Actinic Blank Inspection) using EUV light as inspection light.

Figure 6:
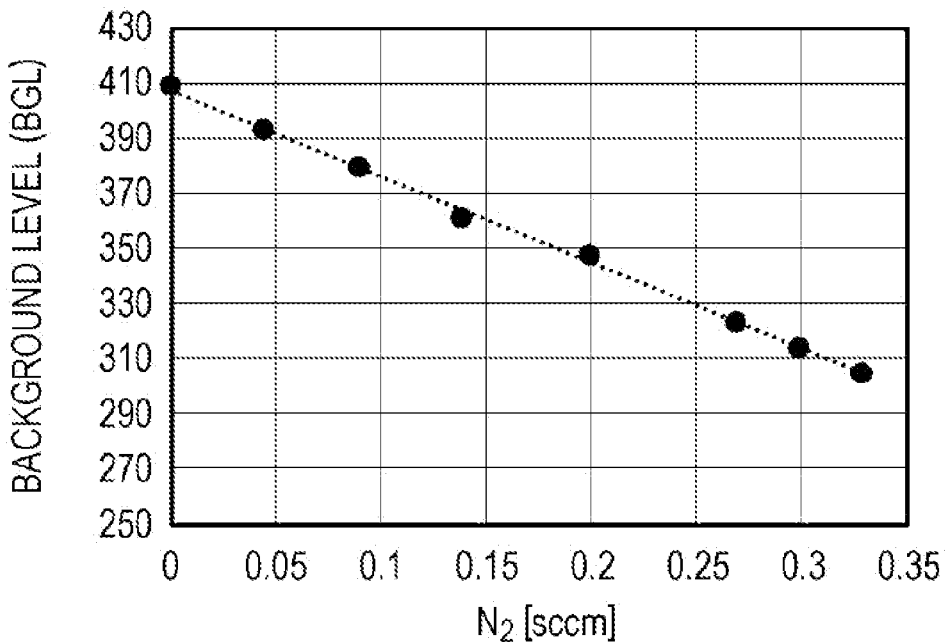
FIG. 6 is a diagram illustrating a relationship between the flow rate (sccm) of nitrogen ($N_2$) during formation of the multilayer reflective film and the background level (BGL) at the time of defect inspection regarding Samples 1 to 8.
Figure 7:
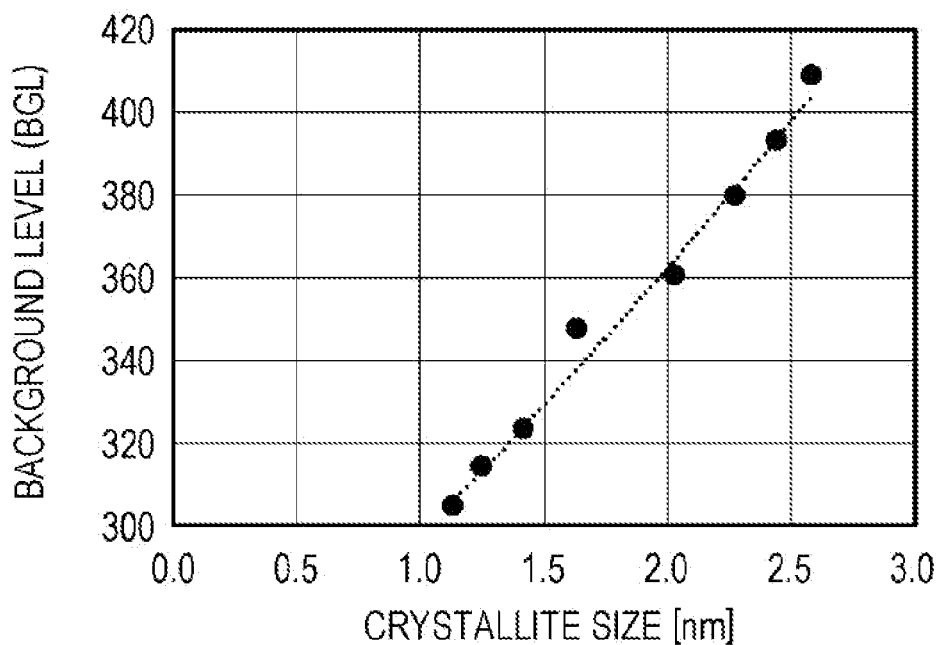
FIG. 7 is a diagram illustrating a relationship between the crystallite size calculated from the diffraction peak of Mo (110) and the background level (BGL) at the time of defect inspection regarding samples 1 to 8.
Figure 10:
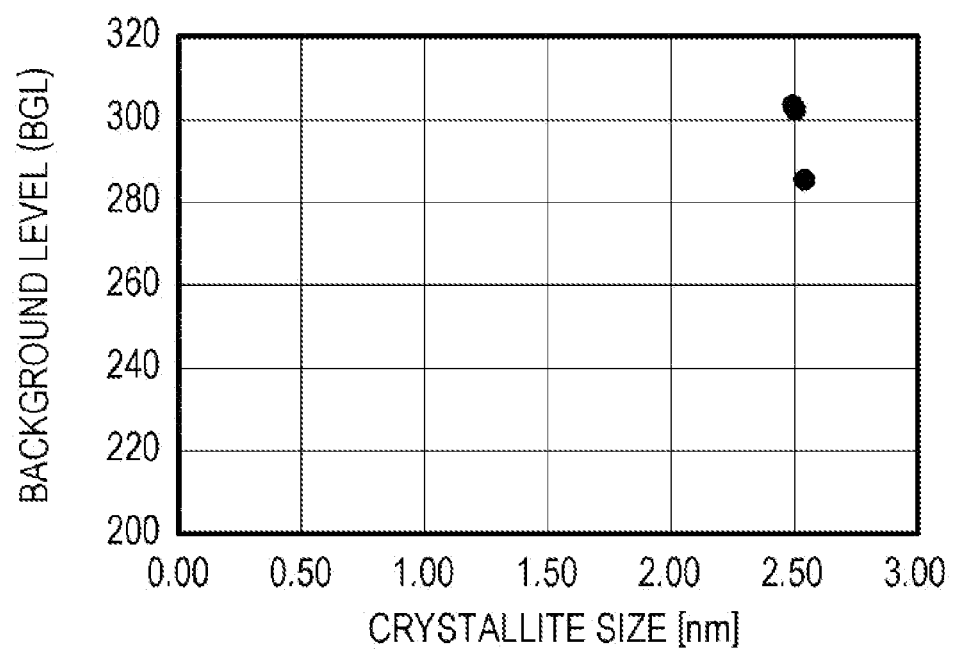
FIG. 10 is a diagram illustrating a relationship between the crystallite size calculated from the diffraction peak of Mo (110) and the background level (BGL) at the time of defect inspection regarding samples 12 to 14.

FIG. 6 is a graph plotting a relationship between the flow rate (sccm) of nitrogen ($N_2$) during the formation of the multilayer reflective film 5 of Samples 1 to 8 and the background level (BGL) at the time of defect inspection. FIG. 7 is a graph plotting a relationship between the crystallite size of Samples 1 to 8 and the background level (BGL) at the time of defect inspection. FIG. 10 is a graph plotting a relationship between the crystallite size of Samples 12 to 14 and the background level (BGL) at the time of defect inspection.

<<Deformation Amount (CTIR)>>

The surface shape of the substrate 1 and the surface shape of the substrate with a multilayer reflective film 110 of Samples 1 to 8 were measured. The measurement results were used to calculate Coordinate Total Indicator Reading (CTIR) representing the deformation amount of the substrate with a multilayer reflective film 110 due to the film stress of the multilayer reflective film 5. CTIR is an absolute value of a difference between the highest value and the lowest value in a difference shape calculated between the surface shape of the substrate 1 and the surface shape of the substrate with a multilayer reflective film 110. In CTIR measurement, a flatness measuring apparatus (UltraFlat200 manufactured by Tropel) was used to measure the surface shape of the substrate 1 and the surface shape of the substrate with a multilayer reflective film 110 after formation of the multilayer reflective film 5. The CTIR value was obtained by calculating the difference shape at 132 mm square in the film formation area.

Figure 9:
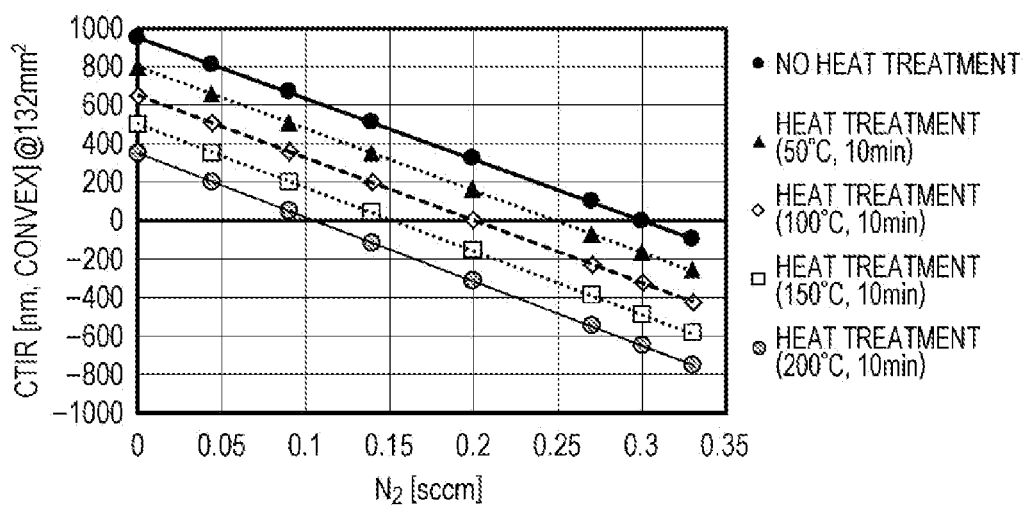
FIG. 9 is a diagram illustrating a relationship between the flow rate (sccm) of nitrogen ($N_2$) during formation of the multilayer reflective film and Coordinate Total Indicator Reading (CTIR), which is a deformation amount of the substrate with a multilayer reflective film due to film stress of the multilayer reflective film in a case where various levels of heat treatment are applied, regarding Samples 1 to 8.

The "no heat treatment" column in Table 1 illustrates CTIR values of the substrate with a multilayer reflective film 110 that has no heat treatment for Samples 1 to 8. In addition, the surface shape measurement results when the heat treatment temperature was set to 50° C., 100° C., 150° C., and 200° C. for the substrate with a multilayer reflective film 110 fabricated under the same conditions as Samples 1 to 8 were used to measure CTIR. The heat treatment time was 10 minutes. Table 1 illustrates CTIR values of Samples 1 to 8 obtained by heat treatment. FIG. 9 is a graph plotting a relationship between CTIR and the flow rate (sccm) of nitrogen ($N_2$) at formation of the multilayer reflective film 5 illustrated in Table 1. In CTIR values of Table 1 and FIG. 9, "+" indicates the presence of a compressive stress, while "–" indicates the presence of a tensile stress.

<Evaluation Results of Substrate with a Multilayer Reflective Film 110>

In Sample 1, the low refractive index layer did not contain nitrogen, the crystallite size calculated from the diffraction peak of Mo (110) was as large as 2.6 nm, and the background level (BGL) was as high as 408. In contrast, Samples 2 to 7 and 9 to 11, corresponding to Examples of the present disclosure, contain an additive element (nitrogen, zirconium, or boron) in the low refractive index layer, and the crystallite size is 2.5 nm or less, with the background level (BGL) being a low value of less than 400. Samples 2 to 7 and 9 to 11 had a high reflectance of 67% or more. Accordingly, by forming the low refractive index layer by a film containing Mo and a predetermined additive element and setting the crystallite size to 2.5 nm or less, it is possible to obtain the multilayer reflective film 5 having a high reflectance and a low background level at the time of defect inspection.

In Samples 12 to 14 corresponding to Examples of the present disclosure, the multilayer reflective film 5 contained an additive element (hydrogen or deuterium), and the crystallite size of the multilayer reflective film 5 was 2.54 nm or less. The crystallite sizes of Samples 12 to 14 were 2.54 nm, 2.51 nm, and 2.50 nm, all about 2.5 nm. These crystallite sizes were similar to some of the samples containing other additive elements, or slightly above 2.50 nm, with the background level (BGL) being 303 or less, making it possible to achieve sufficiently low level when compared with the other Examples. In these Examples, hydrogen or deuterium were added at both the formation of the low refractive index layer and formation of the high refractive index layer, leading to a result that hydrogen or deuterium is contained in the low refractive index layer and/or the high refractive index layer. Alternatively, however, hydrogen or deuterium may be contained in the high refractive index layer alone. When the additive was hydrogen or deuterium, a satisfactory multilayer reflective film was obtained even when the additive was contained in the high refractive index layer. It is reasonable to determine that forming the low refractive index layer with a film containing at least Mo, adding hydrogen or deuterium to the multilayer reflective film and setting the crystallite size to at least 2.5 nm or less or 2.54 nm or less would be able to obtain the multilayer reflective film 5 having higher reflectance and sufficiently low background level at the time of defect inspection. While these Examples selected Kr gas as the noble gas, there is no limitation and Ar gas or Xe gas can also be used. Furthermore, the volume ratio of the process gas can be varied during formation of the low refractive index layer and/or during formation of the high refractive index layer.

In Sample 8, the crystallite size was 1.1 nm and a reflectance was as low as 66.9%. This leads to an evaluation that the crystallite size setting to greater than 1.1 nm enabled acquisition of the multilayer reflective film 5 satisfying the reflectance value.

<Reflective Mask Blank 100>

The substrate with a multilayer reflective film 110 in Samples 1 to 7 and 9 to 14 described above includes the multilayer reflective film 5 having a reflectance of 67% or more for the EUV light having a wavelength of 13.5 nm as exposure light, that is, high reflectance. Note that the substrate with a multilayer reflective film 110 of Sample 1 described above has a high background level of 400 or more at the time of defect inspection, leading to prolonged time taken for defect inspection. Furthermore, since the background level at the time of defect inspection is as high as 400 or more, there is a risk of inclusion of real detects in the substrate with a multilayer reflective film 110 that is determined to include no real defect contributing to transfer. Accordingly, it is possible to manufacture the reflective mask blank 100 using the substrate with a multilayer reflective film 110 of Samples 2 to 7 and 9 to 14 having a high reflectance (67% or more) and a low background level (less than 400). Hereinafter, a manufacturing method of the reflective mask blank 100 using the substrate with a multilayer reflective film 110 of Samples 2 to 7 and 9 to 14 will be described.

The protective film 6 was formed on the surface of the substrate with a multilayer reflective film 110 described above. The protective film 6 formed of Ru was formed with a thickness of 2.5 nm by the DC sputtering method using a Ru target in an Ar gas atmosphere.

Next, a TaBN film with a thickness of 62 nm was formed as the absorber film 7 by the DC sputtering method. The TaBN film was formed by the reactive sputtering method in a mixed gas atmosphere of Ar gas and $N_2$ gas using a mixture of sintered TaB as a target.

The element ratio of the TaBN film was Ta at 75 atom %, B at 12 atom %, and N at 13 atom %. In the TaBN film at a wavelength of 13.5 nm, the refractive index n was about 0.949, and the extinction coefficient k was about 0.030.

Next, the conductive back film 2 containing CrN was formed on the second main surface (back surface) of the substrate 1 by the magnetron sputtering (reactive sputtering) method under the following conditions. Conditions for forming the conductive back film 2: Cr target, mixed gas atmosphere of Ar and $N_2$ (Ar: 90 atom %, N: 10 atom %), and film thickness 20 nm.

Under the above conditions, the reflective mask blank 100 was manufactured using Samples 2 to 7 and 9 to 14 of the substrate with a multilayer reflective film 110, each sample having a high reflectance and a low background level.

<Reflective Mask 200>

Next, the reflective mask 200 was manufactured using the reflective mask blanks 100 of Samples 2 to 7 and 9 to 14 described above. A method for manufacturing the reflective mask 200 will be described with reference to FIGS. 4A to 4E.

Figure 4A:
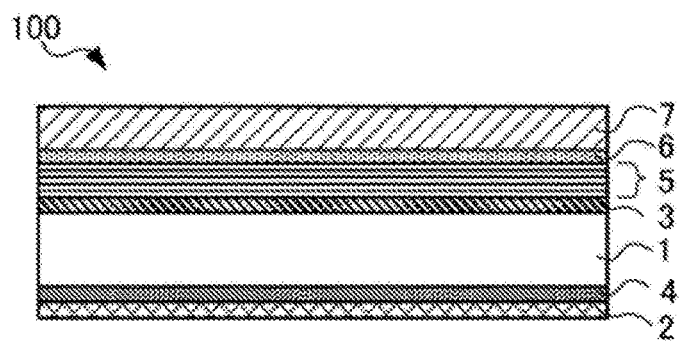
FIGS. 4A to 4E are a process diagram in a schematic cross-sectional view illustrating a manufacturing method of a reflective mask according to one aspect of the present disclosure.
Figure 4B:
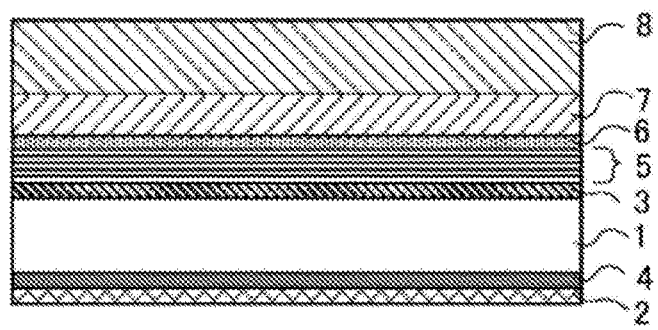
Figure 4C:
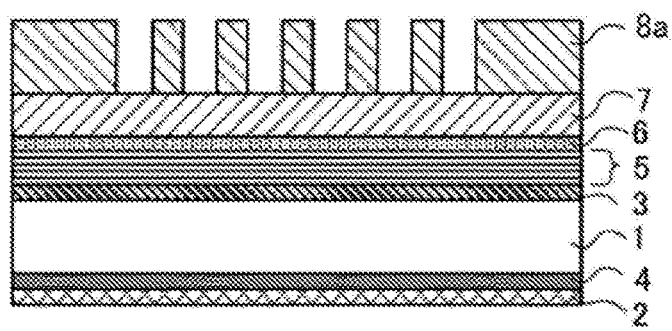
Figure 4D:
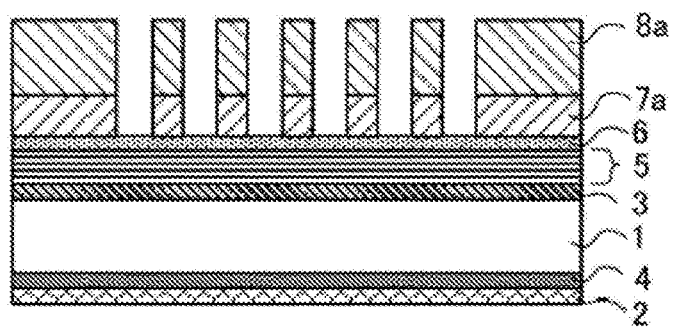
Figure 4E:
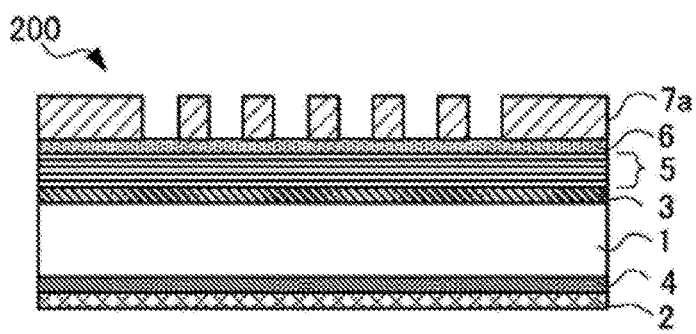

First, as illustrated in FIG. 4B, the resist film 8 was formed on the absorber film 7 of the reflective mask blank 100. Subsequently, a desired pattern such as a circuit pattern was drawn (exposed) on the resist film 8, and further developed and rinsed to form a predetermined resist pattern 8a (FIG. 4C). Next, using the resist pattern 8a as a mask, the absorber film 7 (TaBN film) was dry-etched using $Cl_2$ gas to form the absorber pattern 7a (FIG. 4D). The protective film 6 formed of Ru has extremely high dry etching resistance against $Cl_2$ gas, and thus can act as a sufficient etching stopper. Thereafter, the resist pattern 8a was removed by ashing or resist stripping solution (FIG. 4E).

The reflective masks 200 of Samples 2 to 7 and 9 to 14 were manufactured as described above.

<Manufacture of Semiconductor Devices>

The above-described reflective mask 200 manufactured using the substrate with a multilayer reflective film 110 having a high reflectance and a low background level is set in an EUV scanner, and EUV exposure was performed on wafer on which a film to be processed and a resist film are formed on a semiconductor substrate. Subsequently, the exposed resist film was developed to form a resist pattern on the semiconductor substrate on which the film to be processed was formed.

Etching was performed to transfer this resist pattern to the film to be processed, and with various processes such as formation of an insulating film, conductive film, introduction of dopant, or annealing, a semiconductor device having desired characteristics was successfully manufactured at a high yield.

TABLE 1

| | Gas flow rate at formation of low refractive index layer | | | | | | | | |
|---|---|---|---|---|---|---|---|---|---|
| | Kr flow rate (sccm) | $N_2$ flow rate (sccm) | Crystallite size (nm) | N/(N + Mo) [%] | D1 (nm) | D2 (nm) | Diffusion layer thickness (nm) | Reflectance (%) | Background level (BGL) |
| Sample 1 | 7.40 | 0 | 2.6 | 0 | 1.21 | 0.52 | 1.73 | 68.98 | 408 |
| Sample 2 | 7.40 | 0.045 | 2.5 | 1.1 | 1.15 | 0.51 | 1.66 | 68.70 | 393 |
| Sample 3 | 7.40 | 0.090 | 2.3 | 2.1 | 1.07 | 0.51 | 1.58 | 68.41 | 379 |
| Sample 4 | 7.40 | 0.139 | 2.0 | 3.3 | 1.01 | 0.50 | 1.51 | 68.11 | 360 |

TABLE 1-continued

| | | | | | | | | | |
|---|---|---|---|---|---|---|---|---|---|
| Sample 5 | 7.40 | 0.20 | 1.6 | 4.8 | 0.97 | 0.50 | 1.47 | 67.72 | 347 |
| Sample 6 | 7.40 | 0.27 | 1.4 | 6.4 | 0.93 | 0.49 | 1.42 | 67.28 | 323 |
| Sample 7 | 7.40 | 0.30 | 1.3 | 7.1 | 0.92 | 0.49 | 1.41 | 67.09 | 313 |
| Sample 8 | 7.40 | 0.33 | 1.1 | 7.8 | 0.91 | 0.48 | 1.39 | 66.90 | 304 |

| | Deformation amount of substrate: CTIR (nm) | | | | | |
|---|---|---|---|---|---|---|
| | No heat treatment | Heat treatment (50° c., 10 min) | Heat treatment (100° c., 10 min) | Heat treatment (150° c., 10 min) | Heat treatment (200° c., 10 min) | Remarks |
| Sample 1 | 950 | 800 | 650 | 500 | 350 | Comparative example |
| Sample 2 | 808 | 656 | 504 | 352 | 200 | Example |
| Sample 3 | 664 | 510 | 356 | 202 | 49 | Example |
| Sample 4 | 506 | 350 | 195 | 39 | −117 | Example |
| Sample 5 | 316 | 157 | −1 | −159 | −318 | Example |
| Sample 6 | 92 | −69 | −230 | −392 | −553 | Example |
| Sample 7 | −3 | −166 | −328 | −491 | −653 | Example |
| Sample 8 | −98 | −262 | −426 | −590 | −753 | Comparative example |

TABLE 2

| | Additive element | Process gas | Sputtering target (atom %) | Crystallite size (nm) | Reflectance (%) | Background level (BGL) | Remarks |
|---|---|---|---|---|---|---|---|
| Sample 9 | Zr | Ar gas (30 sccm) | MoZr (97:3) | 2.5 | 67.63 | 395 | Example |
| Sample 10 | Zr | Ar gas (30 sccm) | MoZr (95:5) | 2.4 | 67.02 | 388 | Example |
| Sample 11 | B | Ar gas (30 sccm) | MoB (93:7) | 1.7 | 67.01 | 392 | Example |

TABLE 3

| | Additive element | Process gas volume ratio | Crystallite size (nm) | Reflectance (%) | Background level (BGL) | Remarks |
|---|---|---|---|---|---|---|
| Sample 12 | H | Kr: 98 vol % H$_2$: 2 vol % | 2.54 | 68.97 | 285 | Example |
| Sample 13 | H | Kr: 87 vol % H$_2$: 13 vol % | 2.51 | 68.45 | 302 | Example |
| Sample 14 | D | Kr: 87 vol % D$_2$: 13 vol % | 2.50 | 68.42 | 303 | Example |

What is claimed is:

1. A substrate with a multilayer reflective film, comprising:
   a substrate; and
   a multilayer reflective film configured to reflect exposure light, the multilayer reflective film comprising a stack of alternating layers on the substrate, the alternating layers including a low refractive index layer and a high refractive index layer,
   wherein the multilayer reflective film contains molybdenum (Mo) and at least one additive element selected from nitrogen (N), boron (B), carbon (C), zirconium (Zr), oxygen (O), hydrogen (H) and deuterium (D), and
   wherein a crystallite size of the multilayer reflective film calculated from an X-ray diffraction peak of Mo (110) is 2.5 nm or less.

2. The substrate with the multilayer reflective film according to claim 1,
   wherein the multilayer reflective film contains molybdenum (Mo) and at least one additive element selected from nitrogen (N), boron (B), carbon (C), zirconium (Zr), oxygen (O), and hydrogen (H).

3. The substrate with the multilayer reflective film according to claim 1,
   wherein the crystallite size is greater than 1.1 nm.

4. The substrate with the multilayer reflective film according to claim 1,
   wherein the high refractive index layer contains silicon (Si).

5. The substrate with the multilayer reflective film according to claim 1,
   wherein a thickness of a diffusion layer formed between the low refractive index layer and the high refractive index layer is 1.7 nm or less.

6. The substrate with the multilayer reflective film according to claim 1, further comprising a protective film on the multilayer reflective film.

7. A reflective mask blank comprising:
   a substrate;
   a multilayer reflective film configured to reflect exposure light, the multilayer reflective film comprising a stack of alternating layers on the substrate, the alternating layers including a low refractive index layer and a high refractive index layer; and
   an absorber film formed on the multilayer reflective film,
   wherein the multilayer reflective film contains molybdenum (Mo) and at least one additive element selected from nitrogen (N), boron (B), carbon (C), zirconium (Zr), oxygen (O), hydrogen (H) and deuterium (D), and wherein a crystallite size of the multilayer reflective film calculated from an X-ray diffraction peak of Mo (110) is 2.5 nm or less.

8. The reflective mask blank according to claim 7,
wherein the multilayer reflective film contains molybdenum (Mo) and at least one additive element selected from nitrogen (N), boron (B), carbon (C), zirconium (Zr), oxygen (O), and hydrogen (H).

9. The reflective mask blank according to claim 7,
wherein the crystallite size is greater than 1.1 nm.

10. The reflective mask blank according to claim 7,
wherein the high refractive index layer contains silicon (Si).

11. The reflective mask blank according to claim 7,
wherein a thickness of a diffusion layer formed between the low refractive index layer and the high refractive index layer is 1.7 nm or less.

12. The reflective mask blank according to claim 7, wherein the reflective mask blank includes a protective film between the absorber film and the multilayer reflective film.

13. A reflective mask comprising:
a substrate;
a multilayer reflective film configured to reflect exposure light, the multilayer reflective film comprising a stack of alternating layers on the substrate, the alternating layers including a low refractive index layer and a high refractive index layer; and
an absorber pattern formed on the multilayer reflective film,
wherein the multilayer reflective film contains molybdenum (Mo) and at least one additive element selected from nitrogen (N), boron (B), carbon (C), zirconium (Zr), oxygen (O), hydrogen (H) and deuterium (D), and
wherein a crystallite size of the multilayer reflective film calculated from an X-ray diffraction peak of Mo (110) is 2.5 nm or less.

14. The reflective mask according to claim 13,
wherein the multilayer reflective film contains molybdenum (Mo) and at least one additive element selected from nitrogen (N), boron (B), carbon (C), zirconium (Zr), oxygen (O), and hydrogen (H).

15. The reflective mask according to claim 13,
wherein the crystallite size is greater than 1.1 nm.

16. The reflective mask according to claim 13,
wherein the high refractive index layer contains silicon (Si).

17. The reflective mask according to claim 13,
wherein a thickness of a diffusion layer formed between the low refractive index layer and the high refractive index layer is 1.7 nm or less.

18. The reflective mask according to claim 13, wherein the reflective mask includes a protective film between the absorber pattern and the multilayer reflective film.

19. The reflective mask blank according to claim 7,
wherein the multilayer reflective film is at a first side of the substrate, and
wherein the reflective mask blank comprises a conductive back film on the substrate at a second side opposite to the first side.

20. A method of manufacturing a semiconductor device, the method comprising a process of performing a lithography process on an exposure apparatus using the reflective mask according to claim 13 to form a transfer pattern on a transfer object.

* * * * *